(12) United States Patent
Lee et al.

(10) Patent No.: US 10,566,104 B2
(45) Date of Patent: Feb. 18, 2020

(54) METAL NANOWIRE HAVING CORE-SHELL STRUCTURE COATED WITH GRAPHENE, AND MANUFACTURING METHOD THEREFOR

(71) Applicant: Daegu Gyeongbuk Institute of Science and Technology, Daegu (KR)

(72) Inventors: Youn Gu Lee, Daegu (KR); Young Jun Jeong, Yeongju-si (KR); Yu Mi Ahn, Daegu (KR); Dong Hwa Lee, Busan (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 222 days.

(21) Appl. No.: 15/324,543

(22) PCT Filed: Jul. 9, 2015

(86) PCT No.: PCT/KR2015/007117
§ 371 (c)(1),
(2) Date: Jan. 6, 2017

(87) PCT Pub. No.: WO2016/006943
PCT Pub. Date: Jan. 14, 2016

(65) Prior Publication Data
US 2017/0154701 A1    Jun. 1, 2017

(30) Foreign Application Priority Data
Jul. 9, 2014    (KR) .................. 10-2014-0086175

(51) Int. Cl.
*C23C 16/26* (2006.01)
*H01B 1/02* (2006.01)
(Continued)

(52) U.S. Cl.
CPC .......... *H01B 1/026* (2013.01); *B22F 1/0025* (2013.01); *B22F 1/02* (2013.01); *B22F 9/24* (2013.01);
(Continued)

(58) Field of Classification Search
CPC .. B22F 1/0025; B22F 1/02; B22F 9/24; B22F 2999/00; C23C 16/26; C23C 16/4417;
(Continued)

(56) References Cited

U.S. PATENT DOCUMENTS

| 2013/0008690 A1* | 1/2013 | Wiley | H01B 1/026 |
| | | | 174/120 C |
| 2013/0230717 A1* | 9/2013 | Xia | B22F 1/0025 |
| | | | 428/397 |
| 2014/0044885 A1* | 2/2014 | Boyd | C23C 16/52 |
| | | | 427/534 |

FOREIGN PATENT DOCUMENTS

| KR | 20120115298 A | 10/2012 |
| WO | 2011071885 A2 | 6/2011 |

OTHER PUBLICATIONS

Zhao et al. ("A flexible chemical vapor deposition method to synthesize copper@carbon core-shell structured nanowires and the study of their structural electrical properties" New J. Chem, 2012, 36, p. 1161-1169) (Year: 2012).*
Saiki et al. ("Growth of graphene on Cu by plasma enhanced chemical vapor deposition"Carbon 2012, 50, p. 869-874) (Year: 2012).*
(Continued)

*Primary Examiner* — Travis M Figg
(74) *Attorney, Agent, or Firm* — Yakov Sidorin; Quarles & Brady LLP

(57) ABSTRACT

The present invention relates to a method for manufacturing a nanowire of a core-shell structure including a metal nanowire core and a graphene shell, comprising the steps of:
(Continued)

providing a metal nanowire; and coating the metal nanowire with graphene by a plasma chemical vapor deposition method. In addition, the present invention relates to: a nanowire having a core-shell structure including a metal nanowire core and a graphene shell; and a transparent electrode formed from the nanowire. The transparent electrode formed from the nanowire having a core-shell structure has advantages of having controllable copper oxidation characteristics, being optically, electrically and mechanically excellent, and enabling the transparent electrode to be manufactured at a low cost.

6 Claims, 12 Drawing Sheets

(51) Int. Cl.
B22F 1/02 (2006.01)
H01B 1/04 (2006.01)
C23C 16/505 (2006.01)
B22F 9/24 (2006.01)
C23C 16/44 (2006.01)
B22F 1/00 (2006.01)
C23C 16/513 (2006.01)

(52) U.S. Cl.
CPC .......... *C23C 16/26* (2013.01); *C23C 16/4417* (2013.01); *C23C 16/505* (2013.01); *H01B 1/02* (2013.01); *H01B 1/04* (2013.01); *B22F 2999/00* (2013.01); *C23C 16/513* (2013.01)

(58) Field of Classification Search
CPC .......... C23C 16/505; C23C 16/51; H01B 1/02; H01B 1/026; H01B 1/04
See application file for complete search history.

(56) References Cited

OTHER PUBLICATIONS

Jin et al. ("Shape-Controlled Synthesis of Copper Nanocrystal in ~ Hexadecylamine as a Capping Agent" Angew. Chem. Int., 2011, 16, p. 10560-10564) (Year: 2011).*
Kim et al. ("Methane as an effective hydrogen source for single-layer graphene synthesis on Cu foil by plasma enhanced chemical vapor deposition" Nanoscale, 2013, p. 1221-1226).*
M. Jin, et al., "Shape-Controlled Synthesis of Copper Nanocrystals in an Aqueous Solution with Glucose as a Reducing Agent and Hexadecylamine as a Capping Agent," Agnew. Chem. Int., vol. 50, Sep. 16, 2011, pp. 10560-10564.
T. Terasawa, et al., "Growth of Graphene on Cu by Plasma Enhanced Chemical Vapor Deposition," Carbon, vol. 50, Oct. 1, 2011, pp. 869-874.
Y. Zhao, et al., "A Flexible Chemical Vapor Deposition Method to Synthesize Copper@Core-Shell Structured Nanowires and the Study of Their Structural Electrical Properties," New J. Chem., vol. 36, Mar. 1, 2012, pp. 1161-1169.
International Search Report in related International Application No. PCT/KR2015/7117, dated Oct. 19, 2015, 2 pages.

* cited by examiner

Example 1

Comparative Example 1

METAL NANOWIRE HAVING CORE-SHELL STRUCTURE COATED WITH GRAPHENE, AND MANUFACTURING METHOD THEREFOR

CROSS-REFERENCE TO RELATED APPLICATIONS

This application represents the national stage entry of PCT International Application No. PCT/KR2015/007117 filed Jul. 9, 2015, which claims priority of Korean Patent Application No. 10-2014-0086175 filed Jul. 9, 2014. The disclosure of each of the above-identified patent applications is incorporated herein by reference for all purposes.

TECHNICAL FIELD

The present invention relates to a method of manufacturing a transparent electrode based on a copper nanowire-graphene core-shell structure, and more particularly, to a method of manufacturing a transparent electrode with a controlled oxidation property by coating the surface of a copper nanowire with graphene using low-temperature plasma enhanced chemical vapor deposition. A transparent electrode produced by the manufacturing method according to the present invention may control the property of copper, which is easily oxidizable, and has excellent optical and electrical properties.

BACKGROUND ART

Recently, transparent electrodes have been widely applied with diversification and development of various kinds of portable electronic devices, eco-friendly energy devices such as solar cells, and displays. An energy device needs a transparent electrode because it is required to allow movement of electrons while transmitting light, and transparent electrodes are indispensable in a touchscreen for, for example, a smart phone.

Currently, indium tin oxide (ITO) is the most widely used material of transparent electrodes. The thin film of ITO has high light transmittance and excellent conductivity as an electrode. However, as the demand for ITO increases, there is a growing concern about the amount of indium tin oxide present on the earth. Moreover, there is a problem that the output of indium, which is the core of indium tin oxide, is almost dependent on one country, China. In addition, ITO has a natural ceramic characteristic, which makes it difficult to apply ITO to flexible electric devices. Accordingly, various studies are under way to develop a material that can replace ITO as a transparent electrode.

As nanotechnology evolved, nanomaterials that did not exist or were uncontrolled have been synthesized. Among these nanomaterials, nanocrystals, carbon nanotubes, silicon nanowires, and metal nanowires are being applied to electronic devices. Particularly, the metal nanowires are advantageous in that they can be applied to transparent electrodes because they have high conductivity and are so small that they are indistinguishable in the visible light region.

In particular, silver (Ag) has not only high electrical conductivity and thermal conductivity but also high-efficiency surface-enhanced Raman effect in the visible light region among other metals, and thus has excellent optical properties. When silver (Ag) is prepared in the form of nanowires, it may be applied to various fields ranging from microelectronic devices to transparent electrodes, are also expected to be used as optical, chemical or biosensors.

However, in order for silver nanowires to be used in various fields, mass production of silver nanowires with a uniform thickness, uniform size, clean surface, high aspect ratio, small size deviation is of the greatest importance.

However, silver nanowires have a disadvantage in that growth thereof in the longitudinal direction is limited. According to percolation theory, the longer a linear substance in a certain area is, the smaller the population used to have conductivity is. Such decrease in the population may increase the transmittance, thereby increasing the transparency of the electrode.

Copper is a low-cost material that exhibits as high conductivity as gold or silver. However, unlike gold or silver, copper is easily oxidized in the atmosphere. If copper is divided into nano-size pieces, the surface area increases and thus the copper pieces are more easily oxidized. Therefore, employing copper easily oxidizable in the atmosphere in industries is not possible or requires a very expensive and complex process.

Particularly, as the technical requirements for flexible electronic devices recently increased, there has been a demand for a highly durable and extensible electrode. Among conventional methods of manufacturing an extensible electrode, there is a method of manufacturing a chain-like microstructure using metal nanowires. In this method, an expensive oxidation-stable material such as silver is used to manufacture the microstructure.

However, this method has a disadvantage in that the wires have low conductivity due to weak connectivity therebetween, and fine patterning is not easy. As a method for improving selectivity and conductivity, there is a method of locally sintering silver nanowires using laser, but this method is limited since it requires fabrication of expensive silver nanowires.

Korean Patent Application Publication No. 10-2005-0086693 (entitled "DISPERSION OF NANOWIRES OF SEMICONDUCTOR MATERIAL") discloses a method of manufacturing nanostructures having a substantially uniform length within a given error margin.

Korean Patent Application Publication No. 10-2005-0079784 (entitled "MICROWAVE POWER AMPLIFIER USING COPPER OXIDE NANOWIRE OR COPPER NANOWIRE AS A CATHOD AND MICROWAVE POWERAMPLIFIER MODULE USING THE SAME") discloses a microwave power device including a cathode, a gate, and anode, wherein the cathode is formed of copper oxide nanowires formed by contacting a copper surface with an oxidizing solution at a low temperature below 100° C.

However, since this nanowire manufacturing method does not include a separate process for controlling the oxidation characteristics of copper, it is difficult to control the oxidation characteristics of copper nanowires with this method.

DISCLOSURE

Technical Problem

Accordingly, the inventors of the present invention have devised a method of manufacturing a transparent electrode including metal nanowires with which the oxidation property of a typical metal can be controlled.

That is, it is an object of the present invention to provide a method of manufacturing a nanowire of a core-shell structure including a metal nanowire core and a graphene shell, the method including providing a metal nanowire; and coating the metal nanowire with graphene by plasma enhanced chemical vapor deposition.

It is another object of the present invention to provide a nanowire having a core-shell structure including a metal nanowire core and a graphene shell.

It is another object of the present invention to provide a transparent electrode formed of a nanowire having a core-shell structure.

Technical Solution

In accordance with one aspect of the present invention, a method of manufacturing a core-shell structure nanowire including a metal nanowire core and a graphene shell according to an embodiment of the present invention includes: providing a metal nanowire; and coating the graphene with the metal nanowire by plasma enhanced chemical vapor deposition.

A nanowire having a core-shell structure according to an embodiment of the present invention includes a metal nanowire core and a graphene shell.

A transparent electrode according to an embodiment of the present invention is formed from nanowires having the core-shell structure.

Advantageous Effects

The present invention provides a method of manufacturing a nanowire having a core-shell structure formed by applying graphene onto the surface of a metal nanowire using plasma enhanced chemical vapor deposition. A transparent electrode including the nanowire manufactured using the above-described method may control the oxidation property of the metal, and have excellent optical, electrical and mechanical properties and be manufactured at a low cost.

BEST MODE

Figure 1:
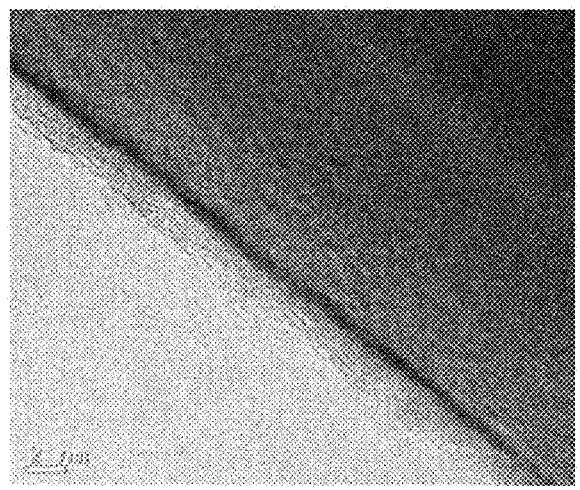
FIG. 1 is an enlarged surface image of a copper nanowire-graphene core-shell structure according to Example 1.

Hereinafter, embodiments of the present invention will be described in detail. It should be understood, however, that the invention is not limited thereto and that various changes and modifications may be made therein without departing from the spirit and scope of the present invention as defined by the appended claims and their equivalents.

As used herein, the term "CuNW" refers to copper nanowires, and the term "CuNW-G" refers to copper nanowires coated with graphene.

According to an embodiment of the present invention, there is provided a method of manufacturing a copper nanowire coated with graphene by introducing graphene onto the surface of a metal nanowire through plasma enhanced chemical vapor deposition. In more detail, the method includes providing a metal nanowire and coating the metal nanowire with graphene by plasma enhanced chemical vapor deposition.

In the present invention, the metal nanowire includes a graphene coating layer, thereby preventing oxidation of the metal and enhancing the optical, electrical and mechanical properties. This is because the reaction with oxygen is blocked by the graphene coating layer and the transmittance and specific resistance are improved, compared to the untreated metal nanowires.

The metal nanowire is coated with graphene by plasma enhanced chemical vapor deposition (PECVD). PECVD may be performed at a temperature between about 300° C. and 800° C. Since PECVD is performed at a low temperature below about 800° C., which is lower than that of the thermal chemical vapor deposition, the metal nanowires may be grown without deforming the substrate.

In one embodiment of the present invention, the metal nanowires may be copper nanowires, aluminum nanowires, zinc nanowires, gold nanowires, silver nanowires, or nickel nanowires. More preferably, the metal nanowires may be copper nanowires.

In one embodiment of the present invention, the thickness of the graphene coating on the metal nanowire may be about 0.3 nm to 30 nm. When the numerical range is satisfied, the light transmittance and the specific sheet resistance are most optimized.

Hereinafter, a method of manufacturing a copper nanowire will be described, and then PECVD will be described.

In one embodiment of the present invention, the method of manufacturing a copper nanowire includes a1) preparing a solution containing a copper chloride compound, ethylenediamine, sodium hydroxide, and hydrazine; and b1) mixing the prepared solution with a polyvinylpyrrolidone aqueous solution and causing the same to react in an ice bath and producing copper nanowires.

In step a1), the solution is prepared by mixing a copper chloride compound such as copper nitrate as a precursor with ethylenediamine, sodium hydroxide, and hydrazine. The copper chloride compound may be copper nitrate, and the concentration of copper nitrate is preferably about 0.01 M to 1.0 M, and more preferably about 0.1 M. The concentration of sodium hydroxide is preferably about 1 M to 18 M, and more preferably about 15 M. Thereafter, in step b1), the copper nanowire is produced by causing the mixed solution prepared in step a1) to react with an aqueous solution of polyvinylpyrrolidone in an ice bath. In this case, step b1) is preferably carried out for about 5 minutes to 300 minutes, more preferably for about 60 minutes.

According to another embodiment of the present invention, there is provided a method of manufacturing a copper nanowire including: preparing a mixed solution by mixing a copper chloride compound, hexadecylamine, glucose, and water (step a2); causing the mixed solution to react in an oil bath and removing hexadecylamine and glucose (step b2); filtering the reacting solution with a membrane filter and then drying the solution to produce the copper nanowire (step c2).

In step a2), $CuCl_2 \cdot 2H_2O$, $Cu(NO_3)_2$, $CuBr_2$ may be used as the copper chloride compound, and the mixed solution is stirred for 24 hours or more.

In the step b2), the oil bath is maintained at about 60° C. to 150° C., preferably about 100° C. The reaction is carried out for 1 to 8 hours, preferably for 4 to 8 hours. During this reaction, the color of the solution changes from sky blue to yellow and finally to red brown, the color of copper. The reactant is then dispersed in water and centrifuged at 2000 rpm to remove hexadecylamine and glucose.

In step c2), isopropyl alcohol is dispersed in the obtained solution after centrifugation, and then the solution is filtered with a cellulose acetate membrane filter to obtain a copper nanowire (CuNW).

After metal nanowires such as copper nanowires are obtained, a substrate on which the metal nanowires are formed is loaded into a plasma processing chamber, and then the inside of the chamber is vacuum-pumped through a vacuum pump to make the pressure of the chamber less than or equal to $5 \times 10^{-6}$ Torr.

Thereafter, a plasma generating gas is flowed into the chamber such that the ratio of Ar to the carbon-containing gas is about 120:1 sccm to 120:30 sccm, preferably 120:3 sccm. As the carbon-containing gas, $CH_4$, $C_2H_2$, $C_2H_4$, CO or the like may be used. When the flowing gas reaches a steady state, RF power (plasma generating power) of about 10 W to 100 W, preferably about 50 W is applied. The pressure in the chamber during plasma processing is between about 10 mTorr and 50 mTorr. Such plasma enhanced chemical vapor deposition is performed at a temperature between about 300° C. and 800° C. The graphene formation process is preferably performed for about 3 minutes to 9 minutes, and more preferably for about 6 minutes.

When the plasma processing is completed, supply of the plasma generating power is stopped, and supply of the plasma generating gas is immediately stopped. Then, when the plasma generating gas remaining in the chamber is fully exhausted, the chamber is vented. Upon completion of venting the chamber, the substrate is unloaded from the chamber.

Another embodiment of the present invention provides a nanowire having a core-shell structure including a metal nanowire core and a graphene shell, fabricated according to the above method. Since the metal nanowire coated with graphene is prevented from being oxidized, the transparent electrode including the same has excellent optical, electrical and mechanical properties by preventing oxidation of the metal and also has a low cost of manufacture.

In one embodiment of the present invention, the coating of the graphene shell applied onto the metal nanowire may be formed in a single layer or multiple layers, and the thickness of the graphene shell may be about 0.3 nm to 30 nm. When this numerical range is satisfied, the light transmittance and the specific sheet resistance are most optimized.

In one embodiment of the present invention, the length of the metal nanowire having a core-shell structure may be about 5 μm to 100 μm preferably about 20 μm. Further, the diameter of the metal nanowire may be about 20 nm to about 150 nm, preferably about 30 nm. If coating of graphene is applied onto the metal nanowire by plasma enhanced chemical vapor deposition, the metal nanowire has flexibility and low stress.

The present invention provides a metal nanowire having an aspect ratio of about 1000 to 3000, which is produced by the above manufacturing method.

Since the metal nanowire of the present invention has a high aspect ratio, it not only exhibits excellent performance as a conductive material, but also has excellent optical, electrical and mechanical properties and high transmittance. In addition, since the metal nanowire with an increased aspect ratio produced according to the manufacturing method of the present invention exhibits a high transmittance in the visible light region, an optical property comparable to that of expensive indium tin oxide (ITO) conventionally used for a transparent electrode layer may be obtained even with a relatively inexpensive metal such as copper.

The present invention also provides a transparent electrode using a nanowire having the core-shell structure. The transparent electrode film according to an embodiment of the present invention has excellent stability against oxidation (see FIG. 5). This is presumably because the graphene shell acts as a protective layer against oxidation to control the oxidation property of metals such as copper, as confirmed in the stability test of Experimental Example 2 below. Since the stability of the transparent electrode film against oxidation according to one embodiment of the present invention is excellent, the solar cell using this film also has excellent power conversion efficiency (see Experimental Example 5).

Hereinafter, the present invention will be described in more detail by way of examples. However, the present invention is not limited to the following examples.

Example 1: Copper Nanowire Coated with Graphene

Fabrication of Copper Nanowires

A mixed solution was prepared by mixing 10 ml of 0.1 M copper nitrate, 1.25 ml of ethylenediamine (EDA), 20 ml of 15 M sodium hydroxide and 250 μl of hydrazine at 80° C. for 20 minutes. The mixed solution and 5 ml of polyvinylpyrrolidone were stirred in an ice bath for one hour to produce copper nanowires.

Coating of graphene by plasma enhanced chemical vapor deposition

The produced copper nanowires were loaded on a graphite stage inside the chamber and heated to 500° C. at a rate of 50° C./min in a vacuum atmosphere (5×10$^{-6}$ mTorr). In order to remove the oxide from the surface of the copper nanowire, a H$_2$ gas was flowed at a flow rate of 40 sccm together with plasma of 50 W of a radio frequency (RF), and a pretreatment process was performed for 2 minutes. The Ar gas was flowed for 3 minutes in order to remove the H$_2$ gas remaining in the chamber, and then a mixed gas of Ar and CH$_4$ was flowed at a flow rate of Ar:CH$_4$=120:3 sccm together with the plasma of RF 50 W. At this time, the pressure was maintained at 10 mTorr and the graphene formation process was performed for 6 minutes. Then, the chamber was cooled to the room temperature at a rate of 18° C./min.

Figure 2:
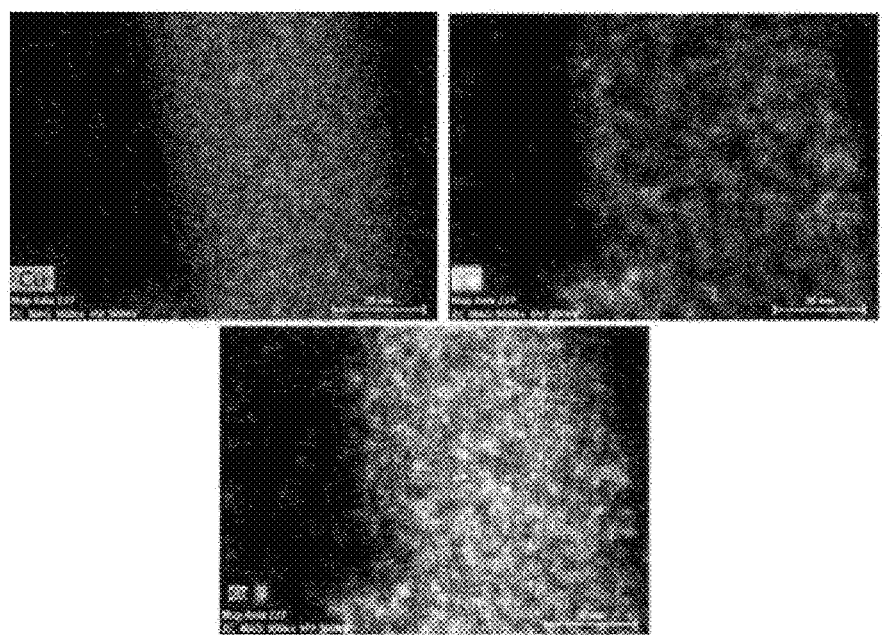
FIG. 2 is an image of a copper nanowire obtained by fluorescent X-ray spectroscopy.

FIG. 1 shows an SEM image of a nanowire of a copper-graphene core-shell structure obtained using the above manufacturing method. The core-shell structure of the nanowire (CuNW-G) formed by coating the surface of the copper nanowire with graphene can be confirmed from the distribution charts of copper and carbon shown in FIG. 2. It can be seen from the figure that the CuNW-G core-shell nanostructure has been successfully formed.

Comparative Example 1: Fabrication of Copper Nanowires

A mixed solution was prepared by mixing 10 ml of 0.1 M copper nitrate, 1.25 ml of ethylenediamine (EDA), 20 ml of 15 M sodium hydroxide and 250 µl of hydrazine at 80° C. for 20 minutes, and then mixed with 5 ml of polyvinylpyrrolidone in an ice bath for one hour. Then, the solution was dried in a nitrogen atmosphere to produce copper nanowires (CuNW).

Figure 3:
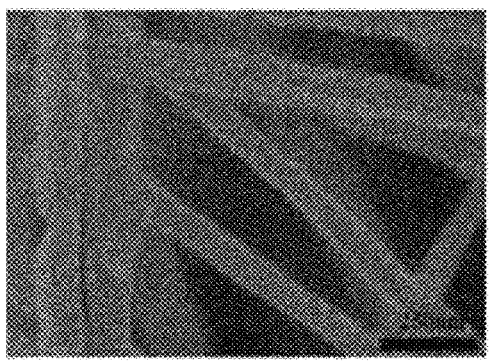
FIG. 3 is a SEM photograph of copper nanowires of Example 1 and Comparative Example 1.
Figure 3:
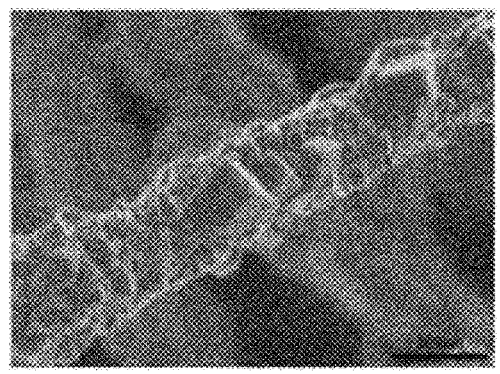

FIG. 3 shows SEM images of nanowires produced in Example 1 and Comparative Example 1. It can be seen from the figure that the nanowire (CuNW-G) of Example 1 has a uniform thickness, a uniform size, and a clean surface in comparison with the nanowire (CuNW) of Comparative Example 1.

Fabrication Example 1: Fabrication of a Transparent Electrode Film

A solution was prepared by mixing 37 ml of acetone, 38 ml of ethanol, 17 ml of ethyl acetate, 12 ml of isopropanol and 20 ml of toluene. 5 mg of the copper nanowire (CuNW-G) coated on the surface with graphene which was fabricated in Example 1 was added to 10 ml of the solution. Then, CuNW-G was dispersed by ultrasonic treatment to prepare an ink formulation. 0.3 ml of the ink formulation was applied onto a glass substrate (3×3 cm$^2$) in a manner of spray-coating. Subsequently, a uniform pressure of 24 MPa was applied to the substrate, and annealing treatment was performed at 300° C. in the Ar atmosphere for one hour to form a nanowire layer having a copper-graphene core-shell structure, thereby producing a transparent electrode film.

Fabrication Examples 2 to 4

A transparent electrode film was fabricated in the same manner as in Fabrication Example 1, except that the ink formulation in which CuNW-G was dispersed was used in the amounts shown in Table 1 below.

Comparative Fabrication Example 1

A transparent electrode was fabricated in the same manner as in Fabrication Example 1, except that CuNW produced in Comparative Example 1 was used instead of CuNW-G produced in Example 1.

Comparative Fabrication Example 2

A transparent electrode was produced in the same manner as in Fabrication Example 1, except that indium tin oxide (ITO) was used instead of CuNW-G produced in Example 1.

Experimental Example 1: Measurement of Light Transmittance and Sheet Resistance

Figure 4A:
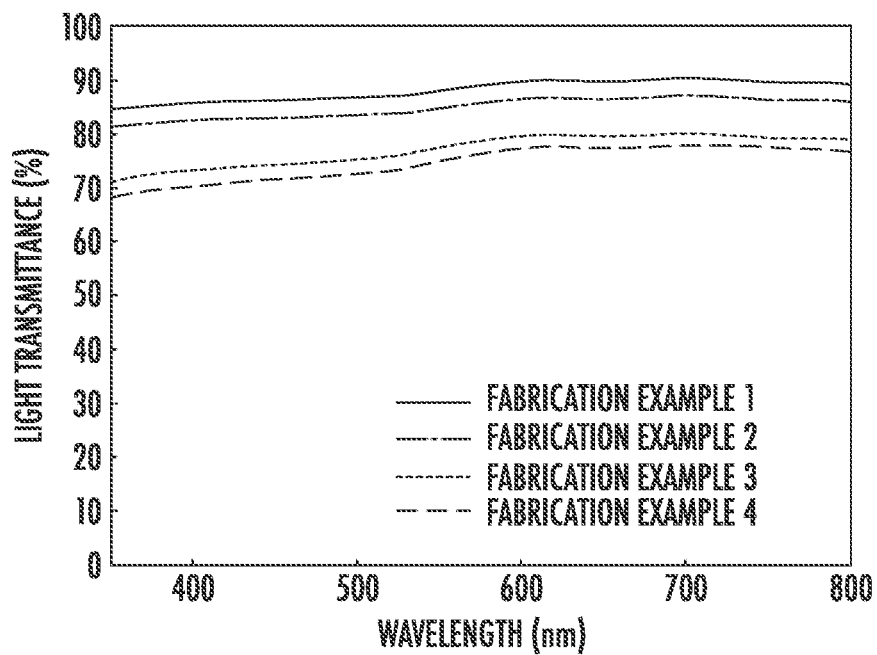
FIG. 4(a) is a graph depicting the light transmittances of transparent electrode films of Fabrication Examples 1 to 4.

The light transmittances and sheet resistances of the transparent electrodes produced in Fabrication Examples 1 to 4 were measured using UV/Vis spectroscopy and a 4-point probe. The results are shown in Table 1 and FIG. 4 below.

TABLE 1

|  | Ink formulation (ml) | Light transmittance (%) at 550 nm | Sheet resistance (Ω/sq) |
|---|---|---|---|
| Fabrication Example 1 | 0.3 | 88.3 | 115.2 |
| Fabrication Example 2 | 0.7 | 85.3 | 50.7 |
| Fabrication Example 3 | 1.0 | 77.4 | 38.0 |
| Fabrication Example 4 | 1.5 | 74.9 | 28.9 |

Figure 4B:
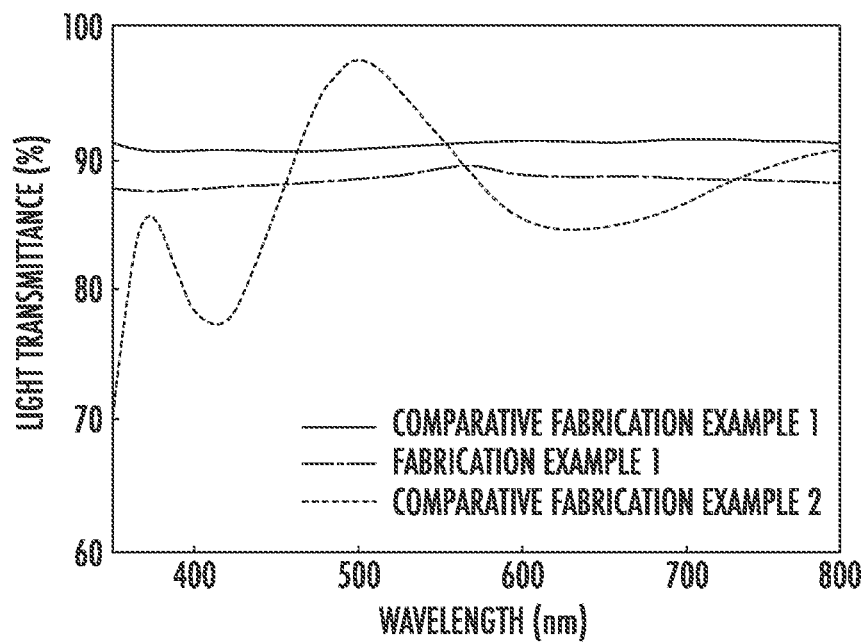
FIG. 4(b) is a graph depicting the light transmittances of transparent electrode films of Fabrication Example 1 and Comparative Fabrication Examples 1 and 2.

FIG. 4(b) shows that the CuNW-G transparent electrode of Fabrication Example 1 and the CuNW transparent electrode of Comparative Fabrication Example 1 have a higher light transmittance in the visible light region than the ITO transparent electrode of Comparative Fabrication Example 2. In addition, the CuNW-G transparent electrodes of Fabrication Examples 1 to 4 have an almost constant light transmittance in the near infrared region. This means that the CuNW-G transparent electrodes of Fabrication Examples 1 to 4 have a high light transmittance at a wide range of wavelengths and suggests that the CuNW-G transparent electrodes of Fabrication Examples 1 to 4 can be used for various optoelectronic devices. The light transmittance of the CuNW-G transparent electrode of Fabrication Example 1 was slightly lower than that of the CuNW transparent electrode of Comparative Fabrication Example 1, which results from additional light absorption of the graphene shell. However, the light transmittance of the CuNW-G transparent electrode of Fabrication Example 1 still shows a higher light transmittance than that of the ITO transparent electrode of Comparative Fabrication Example 1.

Experimental Example 2: Oxidation Stability Test (1) The CuNW transparent electrode of Comparative Fabrication Example 1 and the CuNW-G transparent electrode film of Fabrication Example 1 were subjected to a stability test in a constant temperature and humidity chamber maintained at 25° C. and 50% relative humidity. The stability test was performed by measuring sheet resistances, and the results are shown in FIG. 5.

Figure 5:
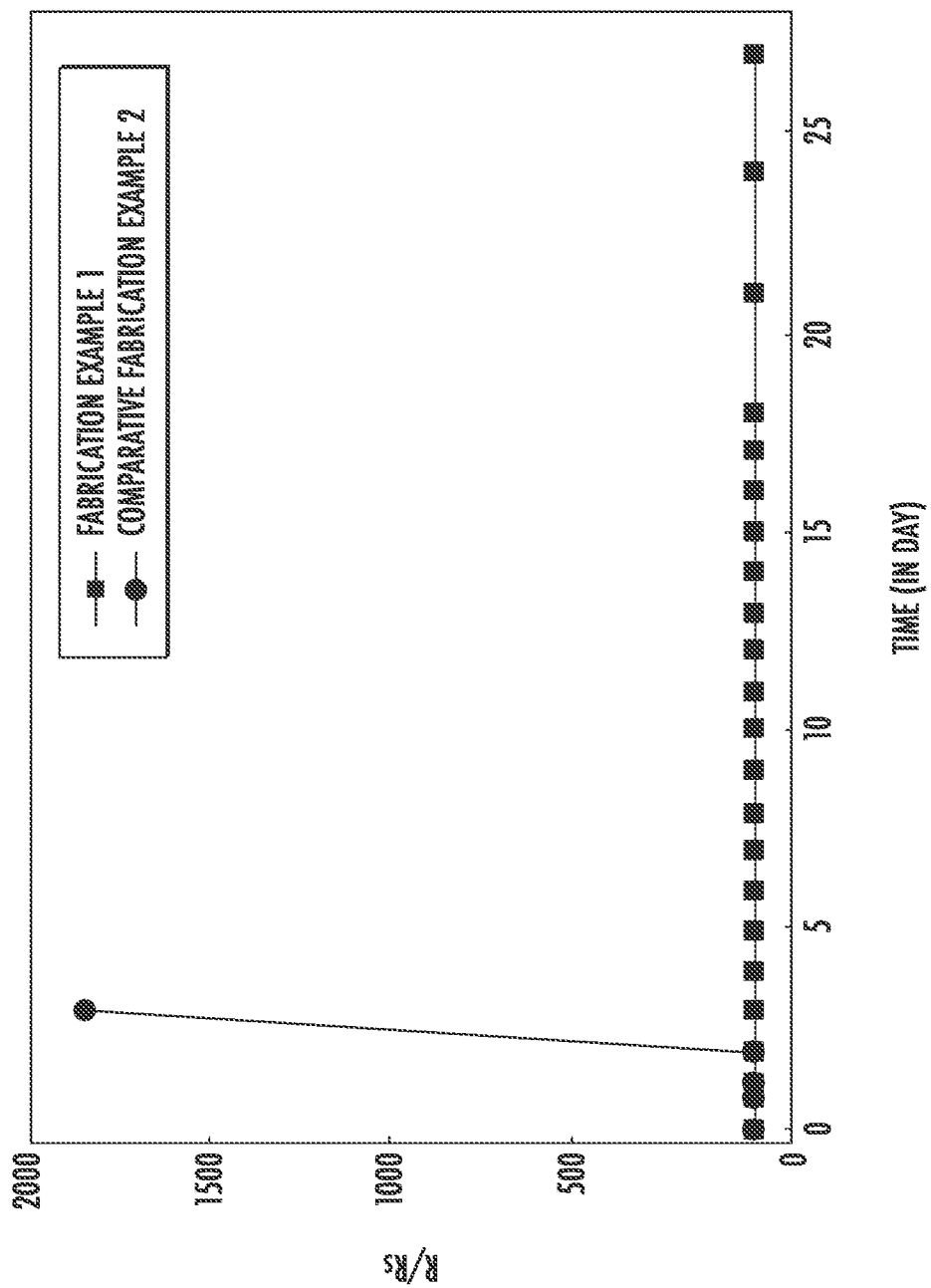
FIG. 5 is a graph depicting the sheet resistances of transparent electrode films of Fabrication Example 1 and Comparative Fabrication Example 1.

As shown in FIG. 5, the resistance of the transparent electrode film of Comparative Fabrication Example 1 rose sharply after three days. On the other hand, the resistance of the transparent electrode film of Fabrication Example 1 was maintained almost constant even after 25 days, which confirms that the oxidation stability of the transparent electrode film of Fabrication Example 1 is excellent.

Figure 6A:
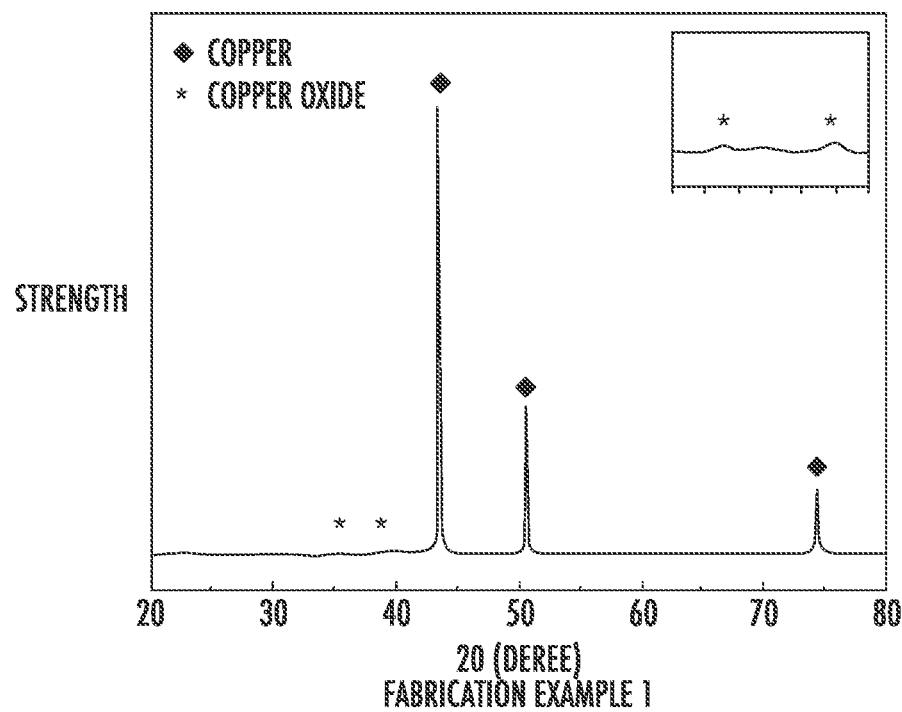
FIG. 6 is a graph depicting the results of stability test of transparent electrode films of Fabrication Example 1 and Comparative Fabrication Example 1.
Figure 6B:
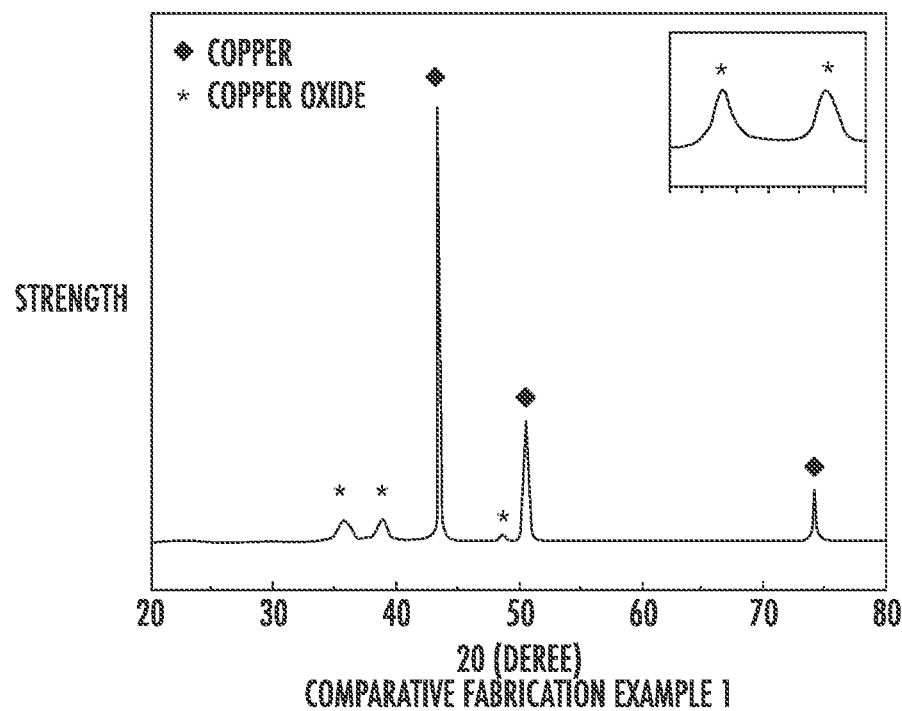
Figure 7:
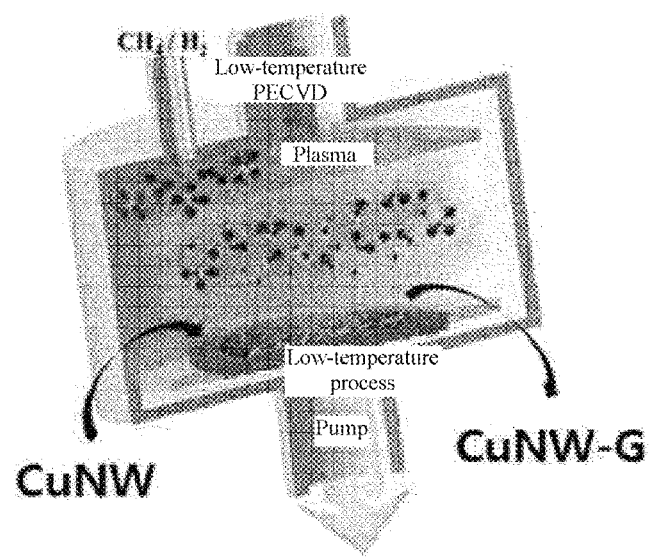
FIG. 7 shows a low-temperature PECVD processing apparatus for synthesis of a copper nanowire (CuNW-G) core-shell nanostructure coated with graphene according to the method of Fabrication Example 1.

(2) The CuNW transparent electrode of Comparative Fabrication Example 1 and the CuNW-G transparent electrode film sample of Fabrication Example 1 were placed in a constant temperature and humidity chamber maintained at 70° C. and 70% relative humidity to perform the stability test. The strengths of copper and copper oxide were measured in CuNW and CuNW-G, and FIG. 6 was obtained as a result.

In the result, the degree of oxidation of the copper nanowire of the transparent electrode film of Fabrication Example 1 was lower than that of the transparent electrode film of Comparative Fabrication Example 1. Thus, the graphene shell can acts as an oxidation protective layer of the metal nanowire, thereby preventing contact between the gas and the metal nanowire and ultimately improving the lifetime of the electronic devices.

Figure 8:
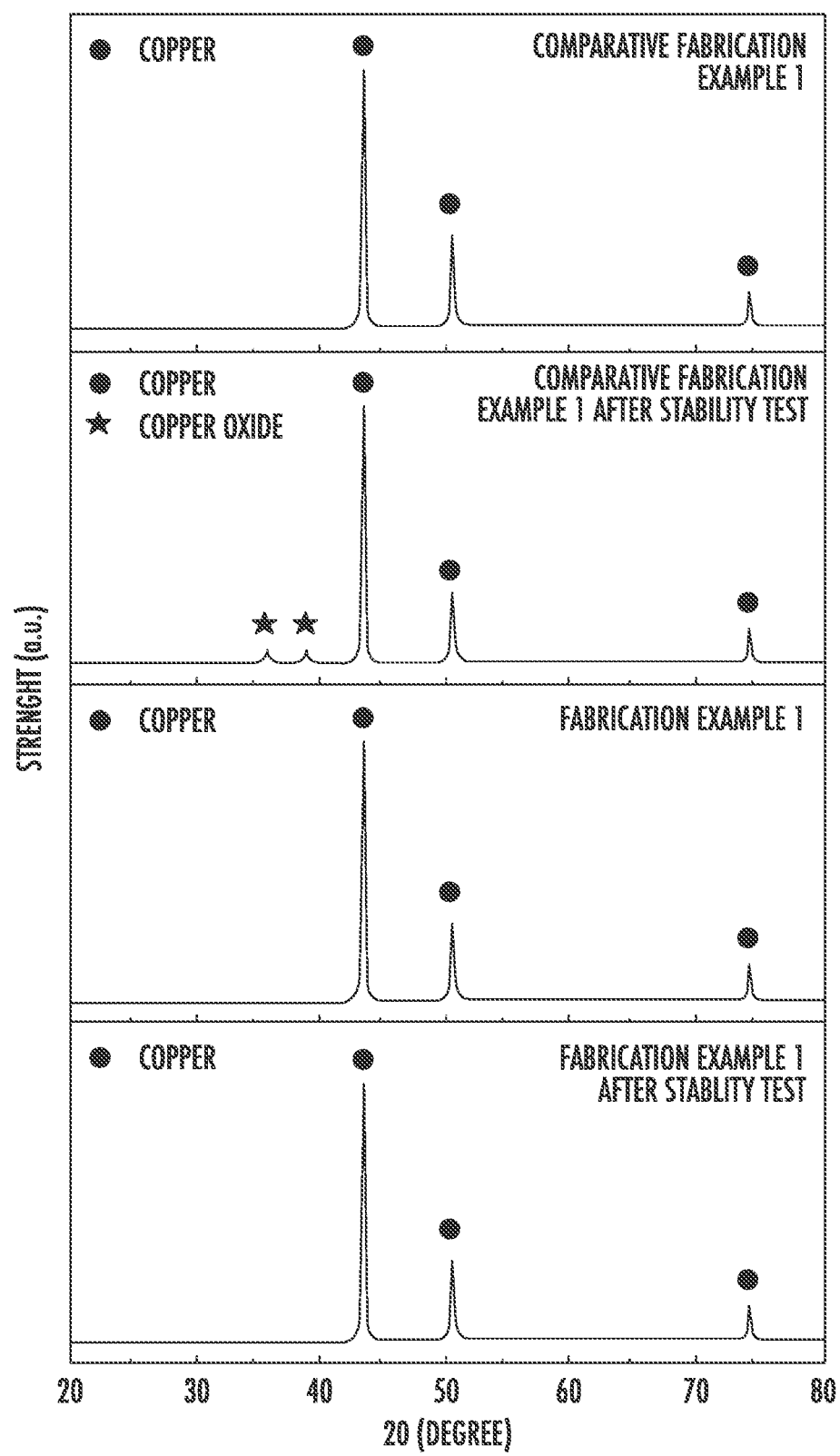
FIG. 8 shows XRD spectra of a copper nanowire (CuNW) transparent electrode of Comparative Fabrication Example 1 and a CuNW-G transparent electrode of Fabrication Example 1.
Figure 9:
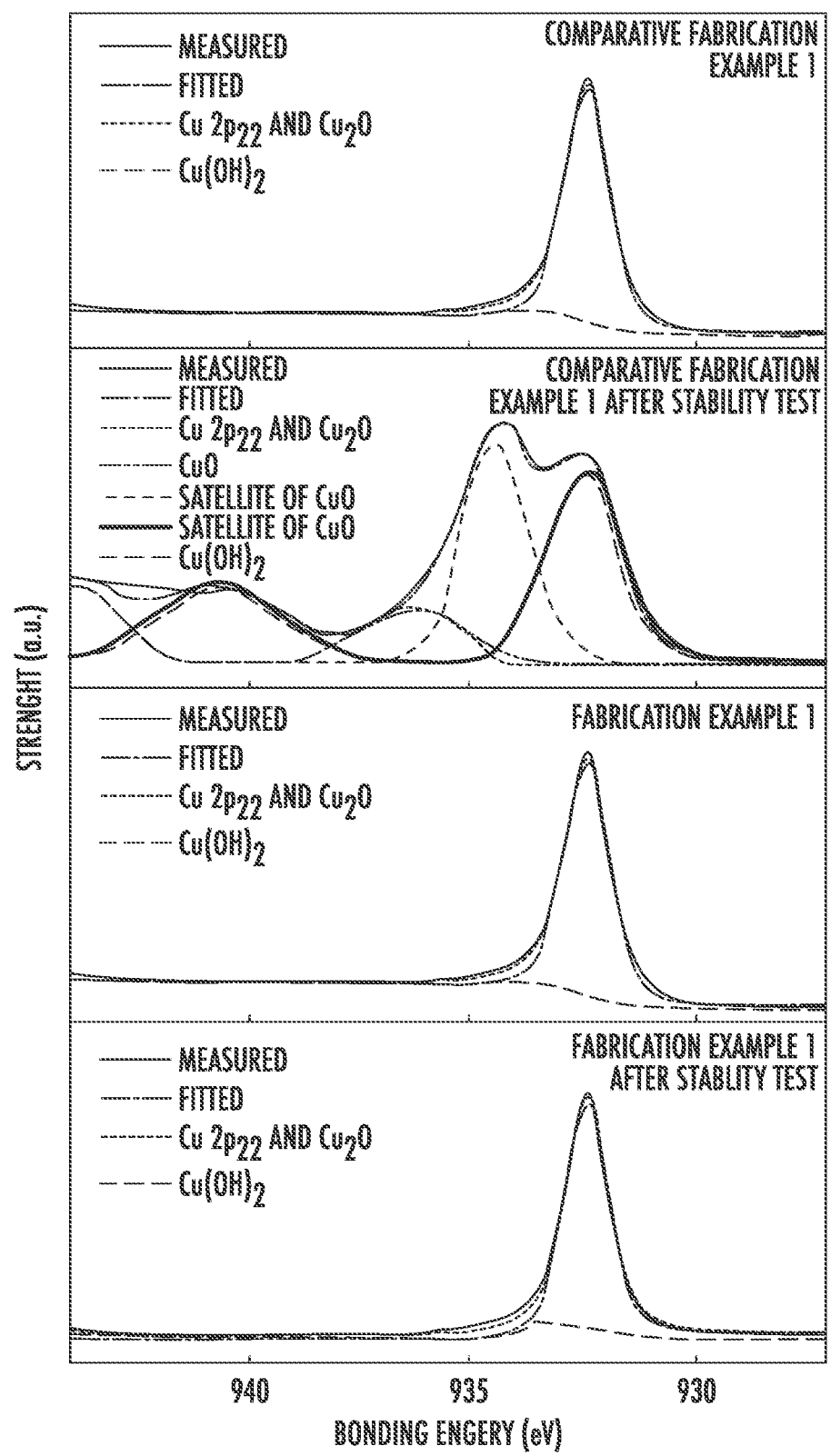
FIG. 9 shows XPS spectra of a CuNW transparent electrode of Comparative Fabrication Example 1 and a CuNW-G transparent electrode of Fabrication Example 1.

(3) The CuNW transparent electrode of Comparative Fabrication Example 1 and the CuNW-G transparent electrode film of Fabrication Example 1 were subjected to a stability test in a constant temperature and humidity chamber maintained at 25° C. and 50% relative humidity, and XRD (FIG. 8) and XPS (FIG. 9) spectra were observed during the test to characterize the compositional changes of both the CuNW transparent electrode of Comparative Fabrication Example 1 and the CuNW-G transparent electrode sample of Fabrication Example 1. In the CuNW transparent electrode, a clear XRD peak was observed at 35.7° and 39.0°, which indicates presence of CuO and $Cu_2O$. On the other hand, in the CuNW-G transparent electrode, the XRD peak intensity of CuO and $Cu_2O$ were negligible, which indicates that oxidation did not occur. The XPS results of these two samples are consistent with the XRD measurements. In the case of the CuNW transparent electrode, a distinct XRD peak corresponding to CuO was observed at 934.4 eV and shake-up satellites of CuO were observed at 940.7 eV and 943.9 eV. On the other hand, in the case of the CuNW-G transparent electrode, strong XPS peaks of CuO and $Cu_2O$ were not observed. This means that moisture and oxygen could not penetrate the graphene shell. Consequently, the CuNW-G transparent electrode hardly shows a change in sheet resistance, compared to the CuNW transparent electrode. This indicates that the graphene shell of Fabrication Example 1 can completely encapsulate the CuNW core and protect the CuNW core from oxidation, thereby improving the long-term stability of the CuNW-G transparent electrode.

Experimental Example 3: TEM Measurement

Figure 10:
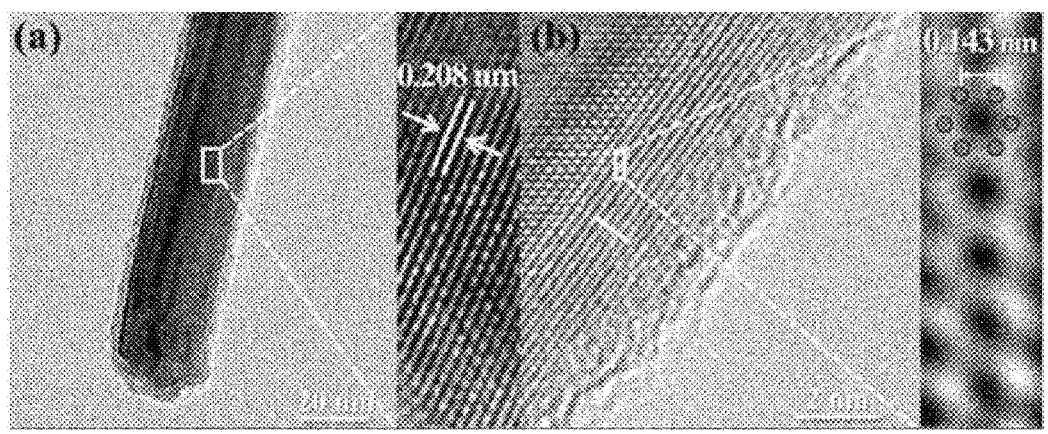
FIG. 10(a) shows a transmission electron microscope (TEM) image of the CuNW-G core-shell nanostructure of Fabrication Example 1.
FIG. 10(b) shows a high-resolution TEM image of the edge of the CuNW-G core of Fabrication Example 1.

The CuNW-G produced in Fabrication Example 1 was observed with a transmission electron microscope (TEM). As a result, it was confirmed that thin layers (10 to 15 layers) having a thickness of about 5 nm were stacked to form a graphene shell for CuNW (FIG. 10(b)). FIG. 10 shows a TEM image of CuNW-G of Fabrication Example 1. FIG. 10(a) shows a TEM image of the middle portion of the CuNW-G core-shell nanostructure. The CuNW lattices were distinctively observed in the middle portion of the CuNW-G core-shell nanostructure. The inter-lattice distance was 0.208 nm. FIG. 10(b) shows a TEM image of the edge portion of the CuNW-G core-shell nanostructure. In this image, only the graphene layer was observed. In addition, the hexagonal arrangement of the carbon rings of the coating of the graphene shell was clearly observed in an inverse fast Fourier transform image (FIG. 10(b)). Here, the measured distance between the two carbon atoms contained in the graphene shell was 0.143 nm due to growth of the nanocrystalline graphene.

Figure 11:
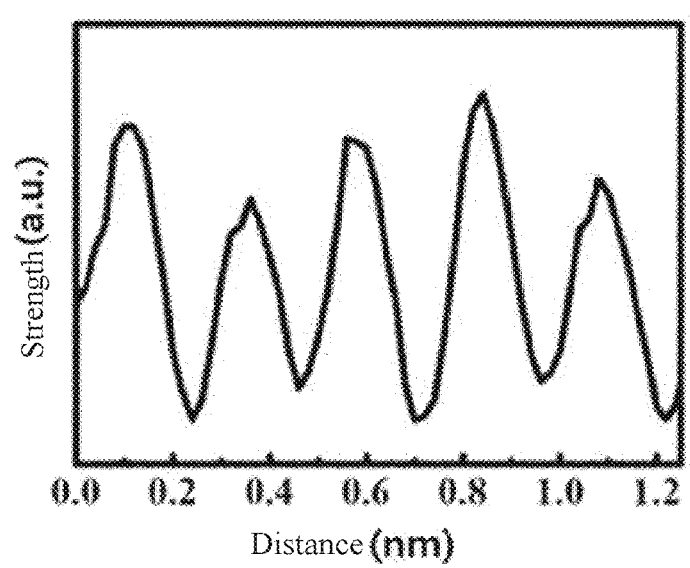
FIG. 11 shows the strength profile of a CuNW-G core-shell nanostructure of Fabrication Example 1.

FIG. 11 shows a strength profile from a single pixel line. The measured lattice constant of the graphene shell was 0.246 nm, which means that the graphene layer was formed on the CuNW.

These TEM results and strength profile indicate that CuNW-G core-shell nanostructure can be successfully synthesized at a low temperature of 400° C. by f the low temperature PECVD process.

Experimental Example 4: Measurement of Raman Spectrum and XPS

Figure 12B:
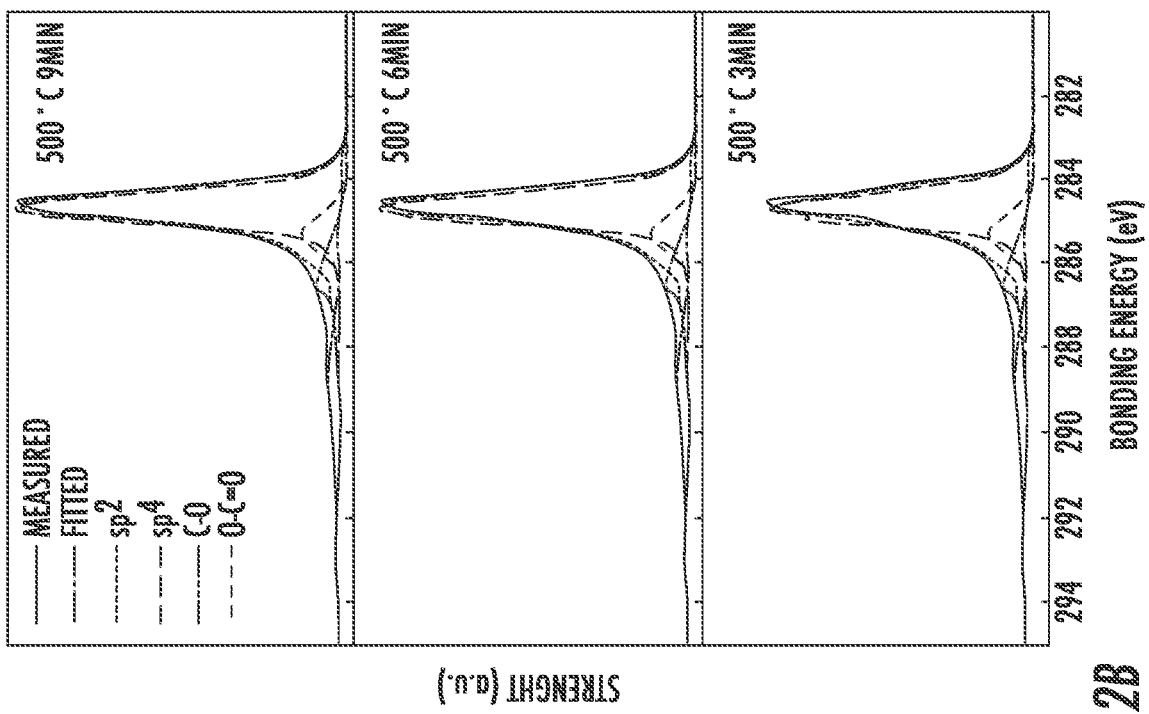
FIG. 12(b) shows change in high-resolution C Is of X-ray photoelectron spectroscopy (XPS) of the CuNW-G core-shell nanostructure of Fabrication Example 1 according to change in processing time.
Figure 12A:
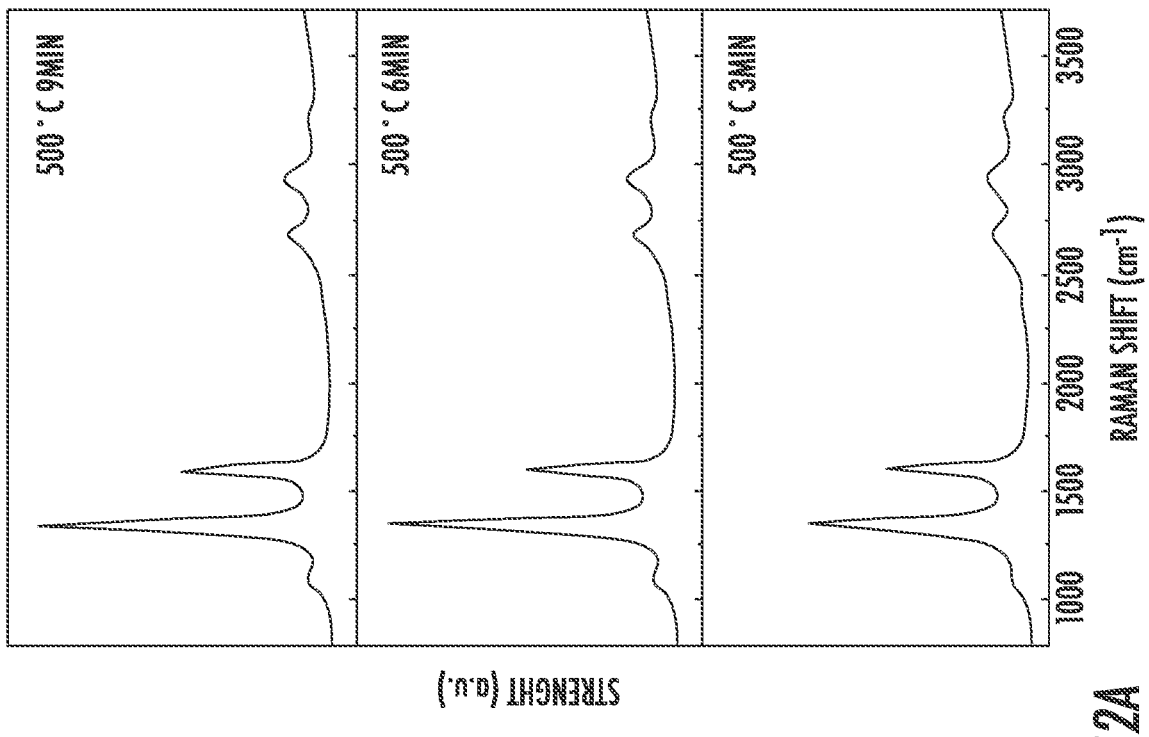
FIG. 12(a) shows the Raman spectrum change of the CuNW-G core-shell nanostructure of Fabrication Example 1.
Figure 13:
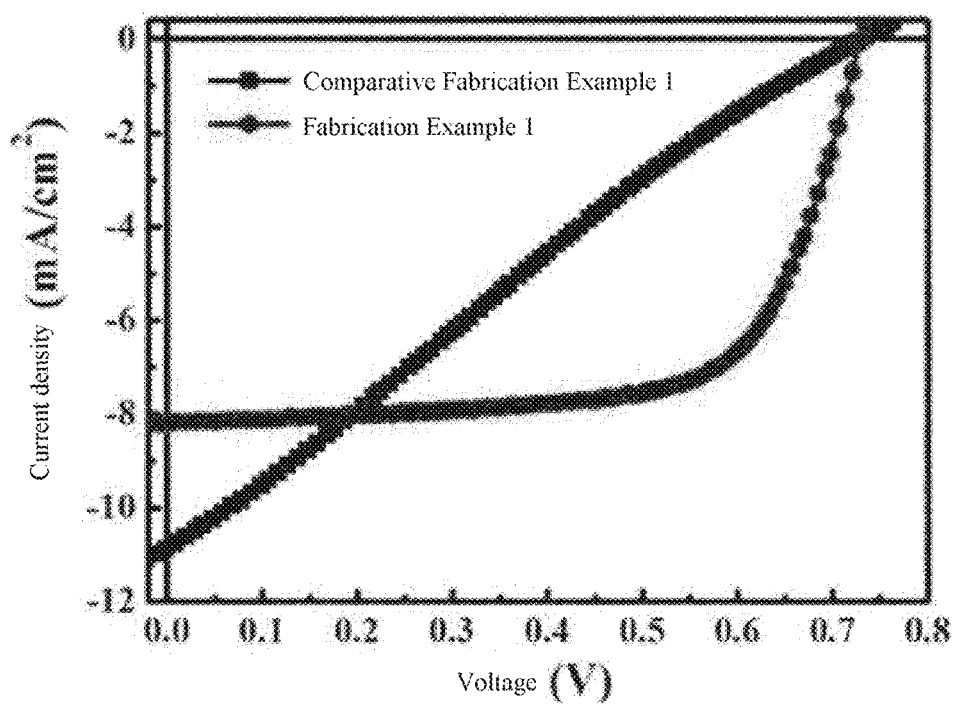
FIG. 13 is a graph of current density-voltage of a polymer solar cell (BHJ PSC) using a CuNW transparent electrode of Comparative Fabrication Example 1 and a CuNW-G transparent electrode of Fabrication Example 1.

The degree of defects and presence of graphene in the CuNW-G core-shell nanostructure of Fabrication Example 1 were examined by Raman spectroscopy. FIG. 12(a) shows Raman spectra measured at an excitation wavelength of 532 nm. They represent typical G and 2D bands of graphene at approximately 1580 $cm^{-1}$ and 2680 $cm^{-1}$, respectively. The 2D band represents double-resonant Raman scattering, and the G band is generated by the $E_{2g}$ photon at the midpoint of the Brillouin region. Appearance of both the G band and the 2D band in FIG. 10(a) indicates that the graphene shell was successfully grown on CuNW by the low temperature PECVD process. In addition, the G band appears to be much stronger than the 2D band, which means that the synthesized graphene shell was grown in multiple layers.

Presence of carbon atoms and quantification of the $sp^2/sp^3$ hybridization ratio in the CuNW-G core-shell nanostructure of Fabrication Example 1 were confirmed through X-ray photoelectron spectroscopy (XPS). FIG. 12(b) shows change in high-resolution C is of X-ray photoelectron spectroscopy (XPS) of the CuNW-G core-shell nanostructure of Fabrication Example 1 produced in the low temperature PECVD process at 500° C. according to change of the processing time. The C 1 s spectrum of the CuNW-G core-shell nanostructure shows a pronounced C sp2 peak at the center at 284.58 eV, which indicates that most of the carbon atoms of the graphene shell were arranged in a two-dimensional graphite-like honeycomb lattice. This confirms that a CuNW-G core-shell nanostructure with a graphene shell formed on CuNW was formed.

Experimental Example 5: PSC Performance Test

In this experiment example, the performance of the CuNW-G transparent electrode was evaluated in regard to the power conversion efficiency (PCE), short circuit current density ($J_{sc}$), and charge rate (FF). To this end, a bulk heterojunction polymer solar cell (BHJ PSC) was fabricated by sequentially depositing PEDOT:PSS (50 nm)/PTB7:$PC_{71}BM$ (80 nm)/LiF (1 nm)/Al (120 nm) on the CuNW transparent electrode of Comparative Fabrication Example 1 and the CuNW-G transparent electrode of Fabrication Example 1. The PCE, $J_{sc}$, and FF of the polymer solar cells having the CuNW transparent electrode of Comparative Fabrication Example 1 and the CuNW-G transparent electrode of Fabrication Example 1 fabricated as above, respectively, were measured.

As a result, the BHJ PSC having the CuNW-G transparent electrode exhibited PCE of 4.04%, $J_{sc}$ of 3.20 $mAcm^{-2}$ and FF of 67.8% at an open circuit voltage ($V_{oc}$) of 0.73 V, while BHJ PSC having the CuNW transparent electrode exhibited PCE of 1.90% and $J_{sc}$ of 10.84 $mAcm^{-2}$ and FF of 24.1% at the open circuit voltage ($V_{oc}$) of 0.73V.

It can be seen from the above results that the power conversion efficiency and charge rate of the PSC having the CuNW-G transparent electrode of Fabrication Example 1 are twice those of the PSC having the CuNW transparent electrode of Comparative Fabrication Example 1.

The invention claimed is:

1. A method of manufacturing a nanowire having a core-shell structure that includes a metal nanowire core and a graphene shell, the method comprising:
   providing a metal nanowire into a plasma-processing chamber;
   removing an oxide from a surface of the metal nanowire by flowing $H_2$ gas in the plasma-processing chamber and generating a plasma using said $H_2$ gas;
   removing the $H_2$ gas from the plasma-processing chamber by flowing Ar gas in the plasma-processing chamber; and
   coating the metal nanowire with graphene by performing plasma-enhanced chemical vapor deposition of graphene while flowing a mixed gas of Ar at a rate of 120 sccm and $CH_4$ at a rate between 1 and 30 sccm and using a radio-frequency power from 10 W to 100 W in the plasma-processing chamber from which the $H_2$ gas has been removed, to form said core-shell structure in which the metal nanowire core is surrounded by said graphene shell.

2. The method according to claim 1, wherein said coating includes coating the metal nanowire with graphene at a temperature of 300° C. to 800° C.

3. The method according to claim 1, wherein providing the metal nanowire includes providing a copper nanowire.

4. The method according to claim 3, wherein providing the metal nanowire includes a1) preparing a mixed solution of a copper chloride compound, ethylenediamine, sodium hydroxide, and hydrazine; and b1) mixing the mixed solution with an aqueous polyvinylpyrrolidone solution and causing the same to react in an ice bath.

5. The method according to claim 3, wherein providing the metal nanowire includes a2) preparing a mixed solution by mixing a copper chloride compound, hexadecylamine, glucose, and water; b2) causing the mixed solution to react in an oil bath for 4 to 8 hours, and removing residual hexadecylamine and glucose from the solution to form a reduced solution; and c2) filtering the reduced solution with a membrane filter and then performing a drying operation.

6. The method of claim 1, wherein said coating the metal nanowire includes forming the coated nanowire that has a uniform diameter of 20 nm to 150 nm.

* * * * *